(12) United States Patent
Gotou et al.

(10) Patent No.: US 8,779,837 B2
(45) Date of Patent: Jul. 15, 2014

(54) LOAD CONTROL DEVICE

(71) Applicant: Panasonic Corporation, Osaka (JP)

(72) Inventors: Kiyoshi Gotou, Hyogo (JP); Masanori Hayashi, Osaka (JP); Takashi Kishida, Osaka (JP); Kouji Yamato, Mie (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 13/910,454

(22) Filed: Jun. 5, 2013

(65) Prior Publication Data
US 2013/0265096 A1    Oct. 10, 2013

Related U.S. Application Data

(63) Continuation of application No. PCT/IB2011/003004, filed on Dec. 13, 2011.

(30) Foreign Application Priority Data

Dec. 14, 2010  (JP) ................................. 2010-278316
Dec. 16, 2010  (JP) ................................. 2010-280980

(51) Int. Cl.
    *H03K 17/56*    (2006.01)
(52) U.S. Cl.
    USPC .......................................... 327/419; 327/447
(58) Field of Classification Search
    USPC ................. 327/419, 447, 452–456; 323/324;
                       307/112, 113, 116, 125, 126, 139, 140
    See application file for complete search history.

(56) References Cited

U.S. PATENT DOCUMENTS

| 7,737,664 B2* | 6/2010 | Matsunaga ................... 320/134 |
| 2002/0130644 A1* | 9/2002 | Telefus ......................... 323/272 |
| 2003/0164721 A1* | 9/2003 | Reichard ....................... 327/108 |
| 2011/0204807 A1* | 8/2011 | Hashizume et al. .......... 315/246 |

FOREIGN PATENT DOCUMENTS

| JP | 2001-78434 | 3/2001 |
| JP | 2005-266971 | 9/2005 |
| JP | 2007-174576 | 7/2007 |
| JP | 2008-160347 | 7/2008 |

OTHER PUBLICATIONS

International Search Report for corresponding International Application No. PCT/IB2011/003004 mailed Feb. 21, 2012.
Form PCT/ISA/237 for corresponding International Application No. PCT/IB2011/003004 dated Feb. 21, 2012.

* cited by examiner

*Primary Examiner* — Lincoln Donovan
*Assistant Examiner* — Diana J Cheng
(74) *Attorney, Agent, or Firm* — Renner, Otto, Boisselle & Sklar, LLP

(57) ABSTRACT

A load control device includes a switching unit which is connected to a power source and a load in series and has a switch device having a transistor structure, a control unit configured to control start-up and stop of the load, and a gate driving unit, which is electrically insulated from the control unit and outputs a gate driving signal to the gate electrode of the switch device. The control unit controls the gate driving unit to supply a higher driving power to the gate electrode of the switch device for a predetermined period of time starting at the start-up of the load than that in a steady state.

18 Claims, 21 Drawing Sheets

LOAD CONTROL DEVICE

This application is a Continuation application of PCT International Application No. PCT/IB2011/003004 filed on Dec. 13, 2011, which designated the United States.

FIELD OF THE INVENTION

The present invention relates to a load control device applicable to a load, such as an illumination device into which an inrush current flows at a time of a start-up of the load.

BACKGROUND OF THE INVENTION

As described in Patent Document 1, for example, to carry out an ON/OFF control of a load, such as an illumination device or the like, a load control device (electronic relay) uses a semiconductor switch device, such as a TRIAC or the like as a switching unit. In such a load control device, the switching unit is connected in series between a commercial AC power source and the load. For example, when an operation handle of a switch is manipulated by a user, a control unit outputs a gate driving signal to put a switch device in an electrical conducting state. Accordingly, power is supplied to a load from the commercial AC power source to thereby start up the load. If a TRIAC serves as the switch device, the TRIAC turns into an electrical non-conducting state by a zero-cross voltage of the commercial AC power source since the TRIAC is a self-extinguishing element. Therefore, the gate driving signal is outputted from the control unit at every half cycle of the commercial AC power source until the operation handle is manipulated again.

Meanwhile, when the operation handle is manipulated by the user, namely, at the startup of the load, a high current referred to as inrush current flows temporarily in the load. For example, if it is assumed that the load is an illumination device using an incandescent lamp, a resistance of a filament in a room temperature is much lower than a steady state resistance of the filament, so that there flows an inrush current, which is equal to or higher than ten times the steady state current of the illumination device.

The transistor as represented by, e.g., MOSFET, is characterized in that a current which can flow between the source and the drain is limited depending on the gate voltage. For this reason, if a low voltage of the gate driving signal is inputted to the gate electrode of the switch device and thus only a current lower than the inrush current can flow, the illumination device is not immediately put into the steady state even when the operation handle is manipulated. Instead, the brightness is gradually increased as temperature of the filament is increased. Therefore, in order to immediately put the illumination device into the steady state after the operation handle is manipulated, a higher voltage of the gate driving signal is preferably inputted to the gate electrode of the switch device to smoothly flow the inrush current at start-up of the load. However, if the voltage of the gate driving signal becomes higher, power consumed by a gate driving unit increases.

In the load control device described in Patent Document 1, the gate driving unit generates the gate driving signal at every half cycle of the commercial AC power source in response to the control signal outputted from the control unit. Since, the gate driving unit and the control unit shares a power source either to generate the gate driving signal or to ensure a driving power for the control unit, it is practically impossible to vary the voltage of the gate driving signal in response to the current flowing through the load.

Further, the load control device described in Patent Document 1 is a so-called two-wire electronic switch connected in series between the commercial AC power source and the load, and the current flows into the load regularly to ensure an internal power thereof. Accordingly, the current flows into the load even while the illumination device is turned off and thus, such a current for ensuring the internal power needs to be set as small as possible such that the load is not erroneously turned on. Consequently, it is required to reduce the power consumed by the control unit and the gate driving unit as low as possible.

[Patent Document 1] Japanese Patent Application Publication No. 2007-174576

SUMMARY OF THE INVENTION

The present invention provides a load control device capable of flowing an inrush current at start-up of a load fully while suppressing power consumed by a control unit and a gate driving unit.

In accordance with an embodiment of the present invention, there is provided a load control device including: a switching unit, which is connected to a power source and a load in series, including a switch device having a transistor structure; a control unit configured to control start-up and stop of the load; and a gate driving unit, which is electrically insulated from the control unit and is configured to output a gate driving signal to a gate electrode of the switch device. Further, the control unit controls the gate driving unit to supply a higher driving power to the gate electrode of the switch device for a period of time starting at the start-up of the load than in a steady state.

Further, the gate driving unit may be electrically insulated from the control unit by having a photo-coupling configuration in which a light emitting part and a light receiving part are provided, and the control unit may control a current, which flows to turn on a light emitting element for a period of time, to be higher at the start-up of the load than in the steady state.

Further, the gate driving unit may be electrically insulated from the control unit by having a magnetic-coupling configuration in which a transformer is provided, and the control unit may control an ON-duty of a driving signal for switching on and off a primary coil of the transformer for a period of time to be greater at the start-up of the load than in the steady state.

Further, the switch device may have a configuration in which two vertical transistor elements are connected in series with their parasitic diodes directed in opposite directions.

Further, the switch device may have a configuration in which two lateral transistor elements are connected in series such that the two lateral transistor elements are driven by the gate driving signal obtained by using a voltage at a connection node therebetween as a reference.

Further, the switch device may include a bidirectional switch element having a lateral transistor structure which uses a GaN/AlGaN structure and has two gate electrodes.

Further, the gate driving unit may further include a charge extraction unit configured to extract residual charges accumulated in the gate electrode of the switch device; a driving power source unit configured to drive the charge extraction unit; and a delay circuit which allows the charge extraction unit not to be operated when the primary coil of the transformer is switched on and off.

Further, the load control device may be a two-wire load control device connected in series between the power source and the load, and the power source may be a commercial AC power source. The two-wire load control device may further include the power source unit configured to ensure power to operate the control unit and the gate driving unit, and the power source unit is connected in parallel to both terminals of the switching unit and operates at every half cycle of the commercial AC power source to ensure an internal power even while the load is not operated.

Further, the load control device described above may further include the power source unit configured to ensure power to operate the control unit and the gate driving unit, and a voltage monitoring unit configured to monitor an output voltage of the power source unit. Further, the control unit may control an ON-duty of the driving signal at the start-up of the load, which is greater than in the steady state, to be equal to an ON-duty in the steady state based on the monitored output voltage of the power source unit.

Further, with respect to the gate electrode of the switch device, the gate driving unit may be configured to perform a constant current drive for a period of time starting at the start-up of the load and perform a constant voltage drive in the steady state.

Further, the switch device may have a configuration in which the vertical transistor elements and a switch element having contacts are connected to each other in series.

Further, the switch device may have a configuration in which the lateral transistor elements and a switch element having contacts are connected to each other in series.

Further, the switch device may have a configuration in which the bidirectional switch element having the lateral transistor structure and a switch element having contacts are connected to each other in series.

Further, the switch device may have a configuration in which the vertical transistor elements and a switch element having contacts are connected to each other in parallel.

Further, the switch device may have a configuration in which the lateral transistor elements and a switch element having contacts are connected to each other in parallel.

Further, the switch device may have a configuration in which the bidirectional switch element having the lateral transistor structure and a switch element having contacts are connected to each other in parallel.

A switch device having a transistor structure is characterized in that the more power is supplied to the gate electrode, the more current flows through the switch device. In accordance with the present invention, the gate driving unit supplies a higher driving power to the gate electrode of the switch device for a predetermined period of time starting at the start-up of the load than in a steady state. Therefore, a current amount that can flow through the switch device is increased, thereby making an inrush current flow fully at the start-up of the load. Further, after the predetermined period of time has elapsed, a driving power corresponding to a current flowing through the load in the steady state is supplied to the gate electrode of the switch device, so that it becomes possible to suppress power consumed by the control unit and the gate driving unit.

BRIEF DESCRIPTION OF THE DRAWINGS

The objects and features of the present invention will become apparent from the following description of embodiments, given in conjunction with the accompanying drawings, in which.

DETAILED DESCRIPTION OF THE EMBODIMENTS

Figure 1:
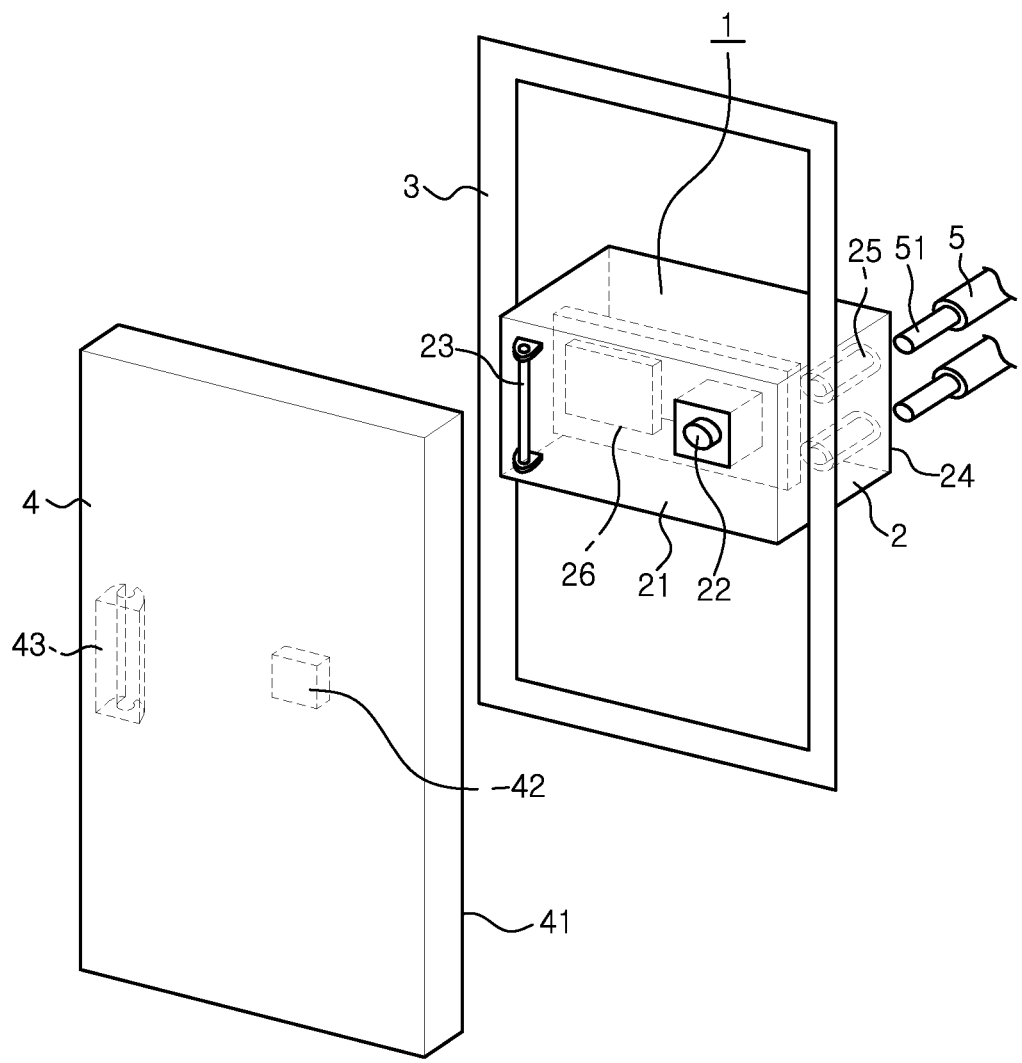
FIG. 1 shows a configuration of a load control device in accordance with an embodiment of the present invention.

Hereinafter, an embodiment of the present invention will be described in detail with reference to the accompanying drawings which form a part hereof. Throughout the specification and drawings, like reference numerals will be given to like parts having substantially the same functions and configurations, and a redundant description thereof will be omitted.

A load control device (e.g., an electronic relay) 1 in accordance with an embodiment of the present invention will be described with reference to FIG. 1. The load control device 1 is an electronic switch in which a switch device having a transistor structure serves as a switching unit, and is used to control start-up (turn on) and stop (turn off) of a load such as an illumination device. FIG. 1 shows a state where the load control device 1 is attached to a building wall. A main body 2 of the load control device 1 is attached to a frame 3, and an operation handle 4 is installed to the main body 2.

On a front surface 21 of the main body 2 of the load control device 1, there are provided a push-on/push-off switch 22 and a hinge 23, which is connected to the operation handle 4. On a rear surface 41 of the operation handle 4, there are formed a protrusion 42 to be in contact with the push-on/push-off switch 22 and a hinge 43 to be connected to the hinge 23. The operation handle 4 is generally biased by a spring of the push-on/push-off switch in one direction to be protruded outwardly from the building wall. Every time the user manipulates the operation handle 4, the push-on/push-off switch 22 is cyclically turned on and off.

At a rear surface 24 of the main body 2 of the load control device 1, there are formed wire inlets 25 into which core wires 51 of wiring cables 5 made of, e.g., a VVF cable (Vinyl insulated Vinyl sheathed Flat-type cable: 600V) are inserted. Further, although a two-wire load control device 1 is described in FIG. 1 as an example of the load control device, a three-wire load control device may be used instead. A circuit board 26 is provided in the main body 2 of the load control device 1, and a switching unit, a control unit, a gate driving unit, a power source unit and the like are mounted on the circuit board 26.

Figure 2:
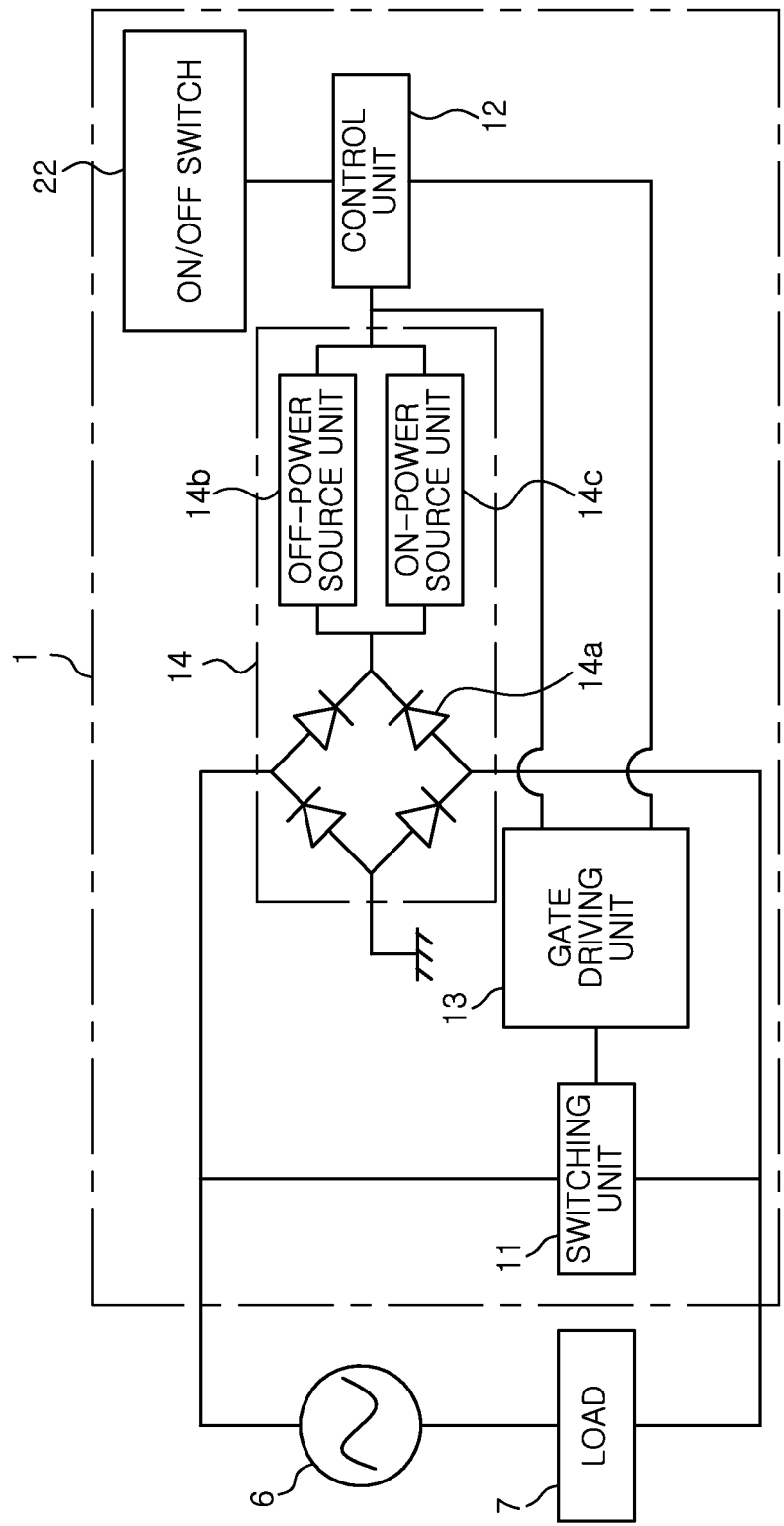
FIG. 2 shows a block diagram of a two-wire load control device.
Figure 3:
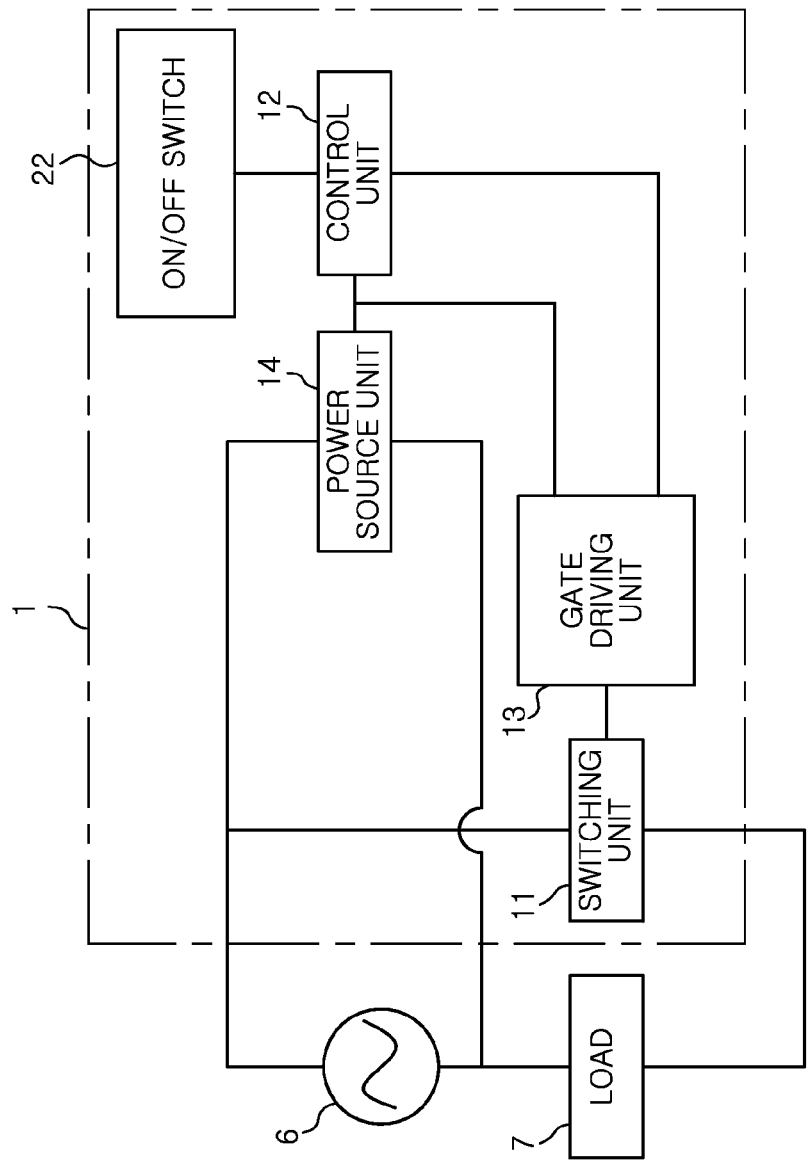
FIG. 3 shows a block diagram of a three-wire load control device.

FIG. 2 shows a block diagram of the load control device 1 having a two-wire configuration. FIG. 3 shows a block diagram of the load control device 1 having a three-wire configuration. The load control device 1 includes a switching unit 11 connected to a commercial AC power source 6 and a load 7 in series; a control unit 12 which controls start-up and stop of the load 7; a gate driving unit 13 electrically insulated from the control unit 12; and a power source unit 14 which ensures power to operate the control unit 12 and the gate driving unit 13. The power source unit 14 is connected in parallel to both terminals of the switching unit 11 and operates at every half cycle of the commercial AC power source 6 to ensure an internal power even while the load 7 is not operated. The switching unit 11 includes a switch device having a transistor structure. The gate driving unit 13 generates a gate driving signal, which is inputted to a gate electrode of the switch device, in response to a control signal outputted from the control unit 12.

In case of the two-wire load control device 1 shown in FIG. 2, the power source unit 14 includes a rectifying unit 14a connected to the commercial AC power source 6 and the load 7 in series; an OFF-power source unit 14b for ensuring power when no power is supplied to the load 7; and an ON-power source 14c for ensuring power when power is supplied to the load 7. Since the specific configurations of the OFF-power source unit 14b and the ON-power source unit 14c are described in detail in Patent Document 1, the detailed description thereof will be omitted. Alternatively, in case of the three-wire load control device 1 shown in FIG. 3, the power source unit 14 includes a rectifying unit and a voltage conversion unit (not shown), and power is regularly supplied thereto from the commercial AC power source 6.

The control unit 12, which includes a CPU, detects whether the push-on/push-off switch 22 is turned on or off, or whether a signal is outputted from the push-on/push-off switch. The push-on/push-off switch 22 may be configured to maintain "ON" or "OFF" state when switched, or may be configured to output a pulse signal whenever the operation handle 4 is manipulated.

Figure 4:
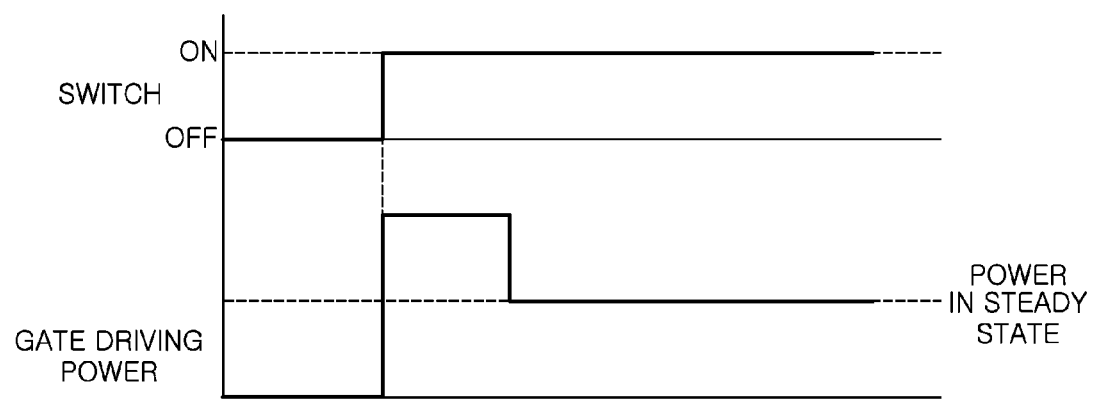
FIG. 4 shows a change in a gate driving power in the load control device.

The switch device included in the switching unit 11 is not particularly limited; the switch device may include a bidirectional switch element such as a TRIAC or the like, or a combination of two one directional switch elements (e.g., two thyristors, two MOSFET, or the like). The MOSFET is characterized in that a current that can flow through a drain-source channel increases as a voltage of the gate driving signal increases. FIG. 4 shows the change in a gate driving power in the load control device 1. In this embodiment, a driving power higher than that in a steady state (normal stable operation) of the load 7 is supplied for a predetermined period of time to the gate electrode of the switch device at the start-up of the load 7, thereby increasing a current that can flow through the switch device. Accordingly, it becomes possible to have an inrush current to flow fully at the start-up of the load 7. In addition, a driving power, which corresponds to a current flowing through the load 7 in the steady state, is supplied to the gate electrode of the switch device after the predetermined period of time has elapsed, thereby reducing power consumed by the control unit 12 and the gate driving unit 13.

Figure 5:
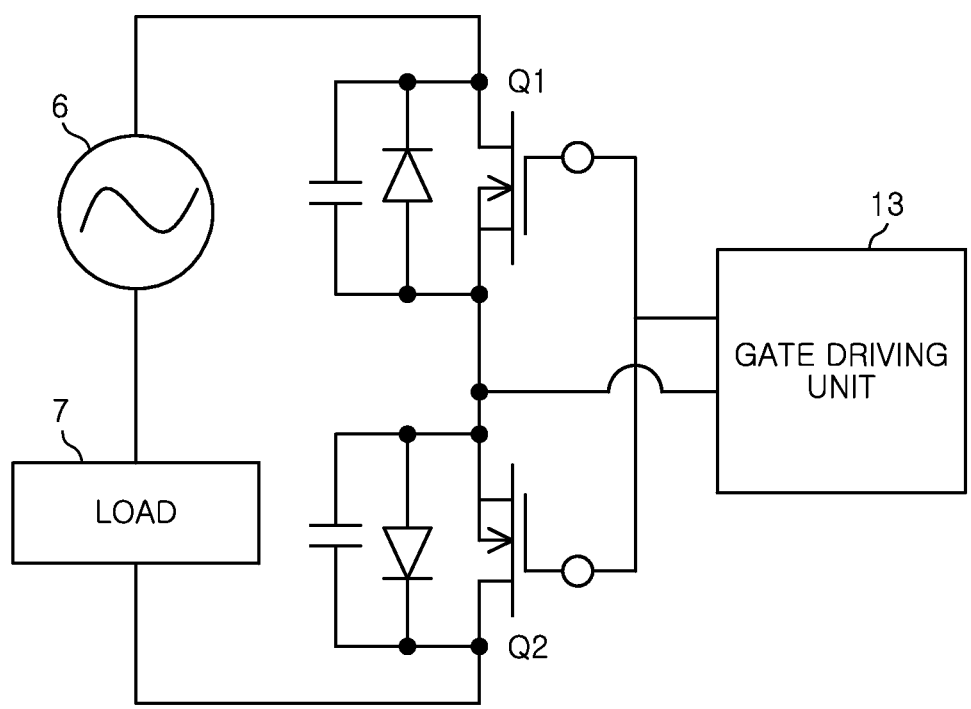
FIG. 5 shows a configuration example in which a vertical MOSFET is used for a switch device.

FIG. 5 shows a configuration example in which two vertical MOSFETs Q1 and Q2 are used for the switch device having the transistor structure, wherein they are connected in series with their parasitic directed in the opposite directions. In this case, the gate driving unit 13 controls the voltage signal, i.e., the voltage of the gate driving signal, by using a voltage at a node between the two vertical MOSFETs Q1 and Q2 as a reference voltage, to thereby control a switching operation of the switching unit 11.

Figure 6:
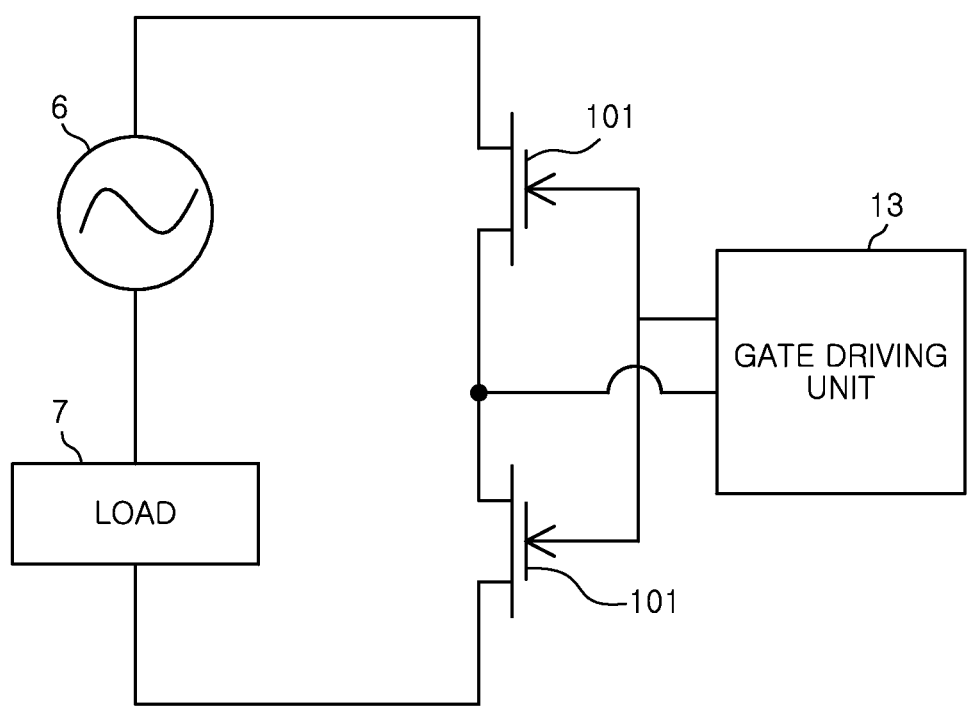
FIG. 6 shows a configuration example in which a switch element having a lateral transistor structure using a GaN/AlGaN structure is used for the switch device.
Figure 7:
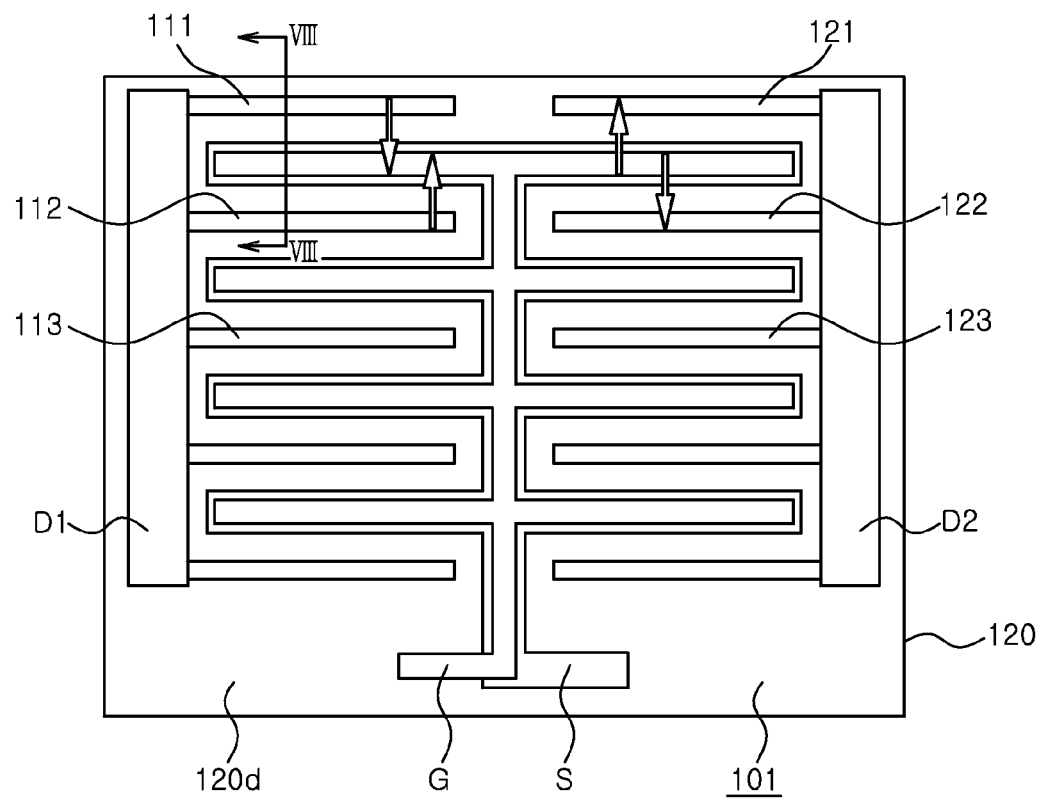
FIG. 7 is a plan view showing a configuration of the switch element having the lateral transistor structure using the GaN/AlGaN structure.

FIG. 6 shows a configuration example in which two switch elements 101 connected in series, each having a lateral transistor structure using a GaN/AlGaN structure, are used for the switch device having the transistor structure. In the similar manner, the gate driving unit 13 controls the voltage signal, i.e., the voltage of the gate driving signal, by using a voltage at a node between the two switch elements 101 as a reference voltage to thereby control a switching operation of the switching unit 11. Each of the switch elements 101 is a lateral single gate transistor element. FIG. 7 is a plan view showing a configuration of the switch element 101, and FIG. 8 is a cross-sectional view taken along line VIII-VIII shown in FIG. 7.

Figure 8:
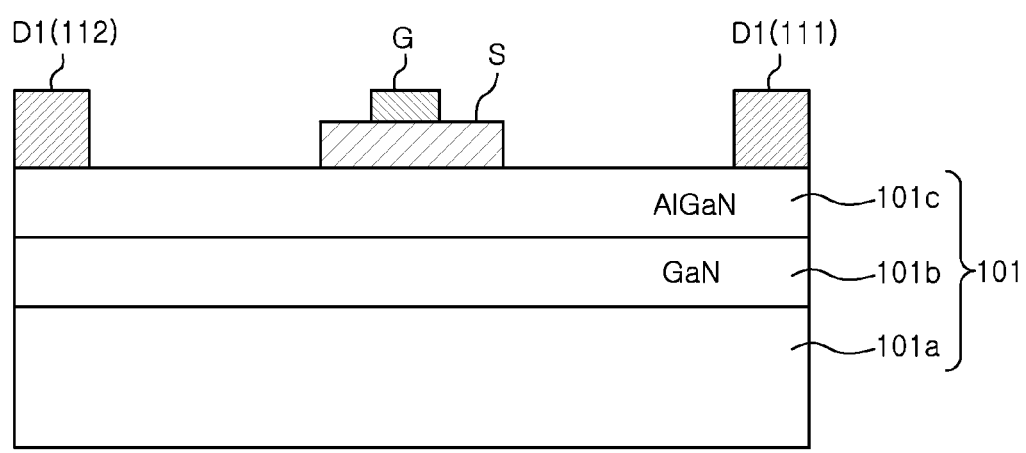
FIG. 8 is a cross-sectional view taken along line VIII-VII shown in FIG. 7.

As shown in FIG. 8, a substrate 120 of the switch element 101 includes a base layer 101a, and a GaN layer 101b and an AlGaN layer 101c which are stacked on the base layer 101a. In this switch element 101, a two-dimensional electron gas layer generated at an AlGaN/GaN heterogeneous interface is used as a channel layer. As shown in FIG. 7, on a surface 120d of the substrate 120, there are formed a first electrode D1 and a second electrode D2, which are connected with the commercial AC power source 6 and the load 7, and an intermediate potential portion S having an intermediate potential between the potentials of the first electrode D1 and the potential of the second electrode D2. Further, a gate electrode G is formed on the intermediate potential portion S. For example, a Schottky electrode is used as the gate electrode G.

The first electrode D1 has a comb shape having electrode portions 111, 112, 113 . . . arranged in parallel to one another, and the second electrode D2 has a comb shape having electrode portions 121, 122, 123 . . . arranged in parallel to one another. The comb-shaped electrode portions of the first electrode D1 and the comb-shaped electrode portions of the second electrode D2 are arranged to face oppositely to each other. The intermediate potential portion S and the gate electrode G are respectively disposed between the comb-shaped electrode portions 111, 112, 113 . . . and 121, 122, 123 . . . , and they have a shape similar to the planar shape of the space defined between the electrode portions.

As shown in FIG. 7, the electrode portion 111 of the first electrode D1 and the electrode portion 121 of the second electrode D2 are arranged such that their center lines in the width direction are aligned with each other. In addition, the corresponding portion of the intermediate potential portion S and the corresponding portion of the gate electrode G are positioned in parallel to the electrode portion 111 of the first electrode D1 and the electrode portion 121 of the second electrode D2. Distances in the width direction from the electrode portion 111 of the first electrode D1 and the electrode portion 121 of the second electrode D2 to the corresponding portions of the intermediate potential portion S and the gate electrode G are set such that a predetermined withstand voltage can be maintained. Distances in the longitudinal direction of the electrode portion 111 of the first electrode D1 and the electrode portion 121 of the second electrode D2, i.e., perpendicular to the width direction are also set in the same manner. In addition, such relationships are applied to those of the other electrode portions 112 and 122, 113 and 123, and so on. That is, the intermediate potential portion S and the gate electrode G are disposed at positions at which a predetermined withstand voltage can be maintained with respect to the first electrode D1 and the second electrode D2.

The intermediate potential portion S having the intermediate potential between the potential of the first electrode D1 and the potential of the second electrode D2, and the gate electrode G connected to the intermediate potential portion S to control the intermediate potential portion S are disposed at positions at which a predetermined withstand voltage can be maintained with respect to the first electrode D1 and the second electrode D2. Therefore, assuming that the first electrode D1 is in a high potential side and the second electrode D2 is in a low potential side, when the switch element 101 is turned off (that is, a signal having a zero voltage is applied to the gate electrode G), the current is completely interrupted between at least the first electrode D1, and the gate electrode G and the intermediate potential portion S. In other words, the current is blocked right under the gate electrode G.

On the other hand, when the switch element 101 is turned on (that is, a signal having a voltage equal to or higher than a predetermined threshold is applied to the gate electrode G), a current flows through a path of the first electrode D1, the intermediate potential portion S, and the second electrode D2 as indicated by the arrow in the FIG. 7, or vice versa.

Since the intermediate potential portion S is disposed at the position at which a predetermined withstand voltage can be maintained with respect to the first electrode D1 and the second electrode D2, it becomes possible to securely turn on/off the switch element 101 even when the threshold voltage of the signal applied to the gate electrode G is lowered to the required minimum level. As a result, a low on-resistance of the switch device can be achieved. Further, the switching unit 11 includes the switch element 101 configured in such a way that the reference (GND) of the control signal is set to have the same potential as the intermediate potential portion S. Accordingly, it becomes possible to directly control the commercial AC power source having a high voltage by the control unit 12 that is driven by a control signal of several voltages. Further, in the lateral transistor element using, as a channel layer, a two-dimensional electron gas layer generated at a heterogeneous interface, there is a trade-off relationship between increasing the potential of a threshold voltage for putting the element in a non-conducting state and the on-resistance in a conducting state. Therefore, the on-resistance can be maintained at a low level by reducing the threshold voltage, thereby achieving the small size and high capacity of the load control device 1.

Figure 9:
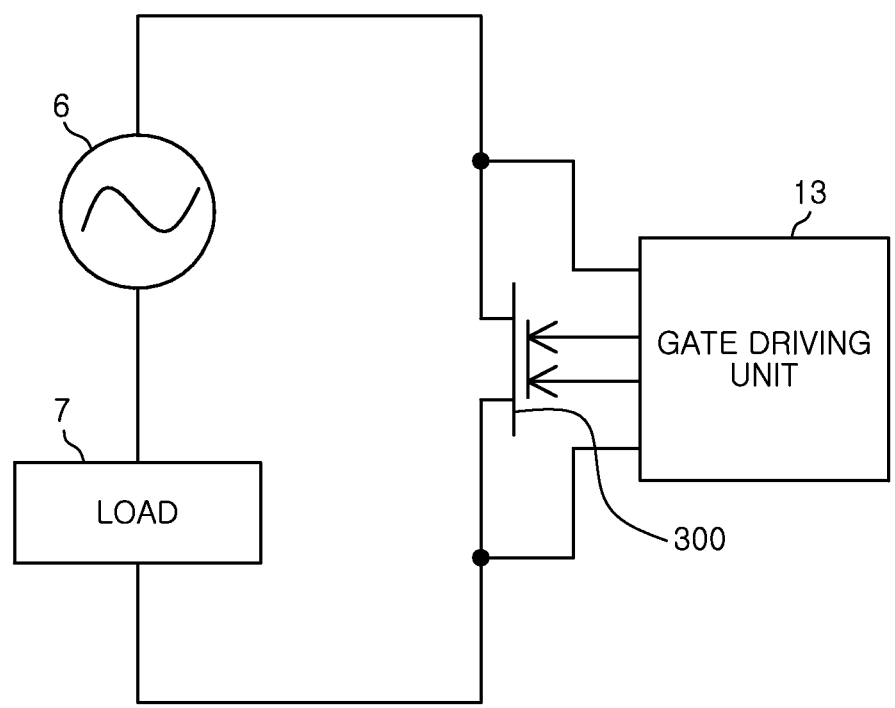
FIG. 9 shows a configuration example in which a bidirectional switch element having a lateral transistor structure using a GaN/AlGaN structure is used for the switch device.
Figure 10:
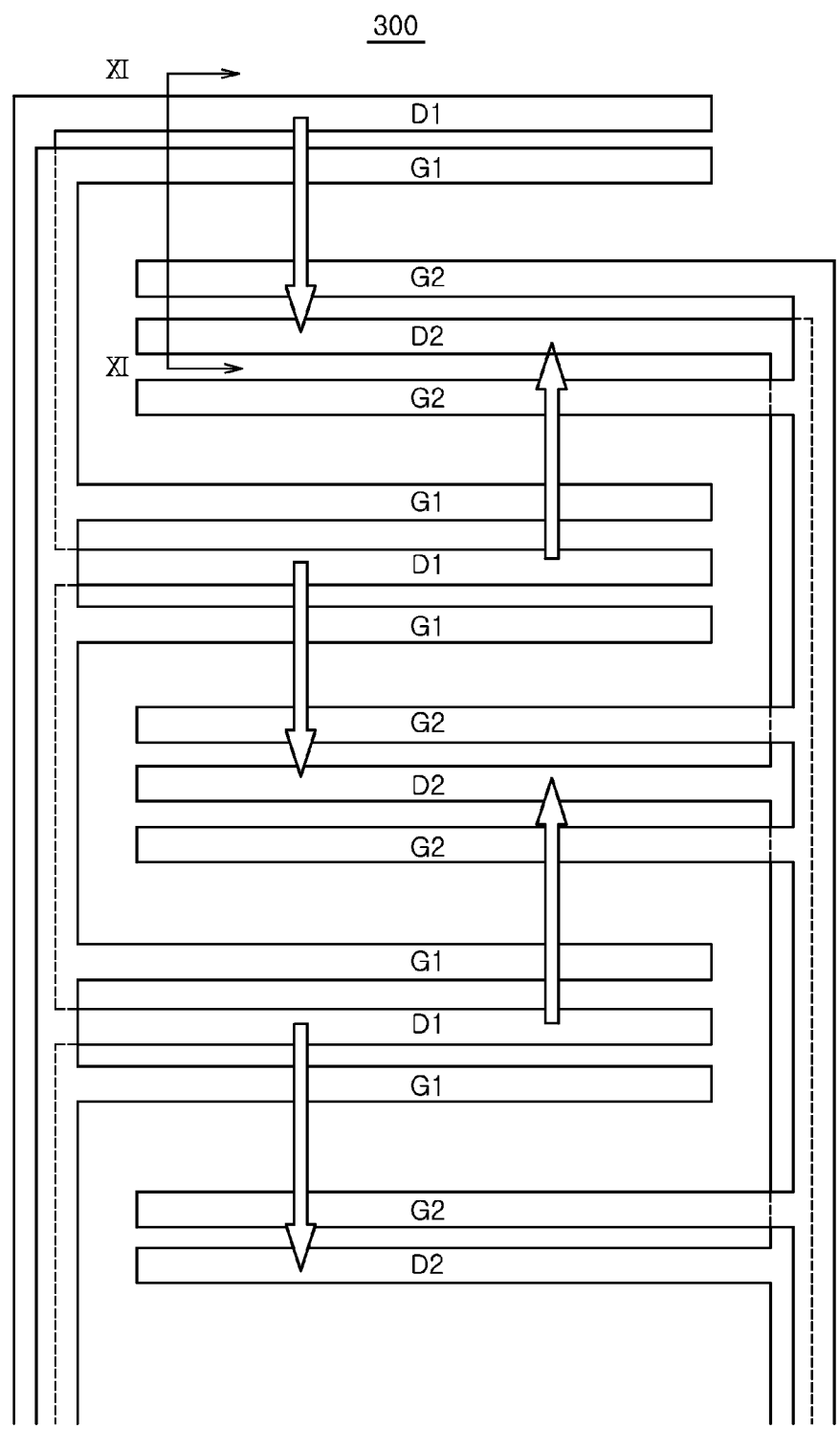
FIG. 10 is a plan view showing a configuration of the bidirectional switch element having the lateral transistor structure using the GaN/AlGaN structure.

FIG. 9 shows a configuration example in which one bidirectional switch element 300 having a lateral transistor structure using a GaN/AlGaN structure is used for the switch device having the transistor structure. The bidirectional switch element 300 has two gate electrodes and is connected to the commercial AC power source 6 and the load 7 in series. FIG. 10 is a plan view showing a configuration of the bidirectional switch element 300, and FIG. 11 is a cross-sectional view taken along line XI-XI shown in FIG. 10.

Figure 11:
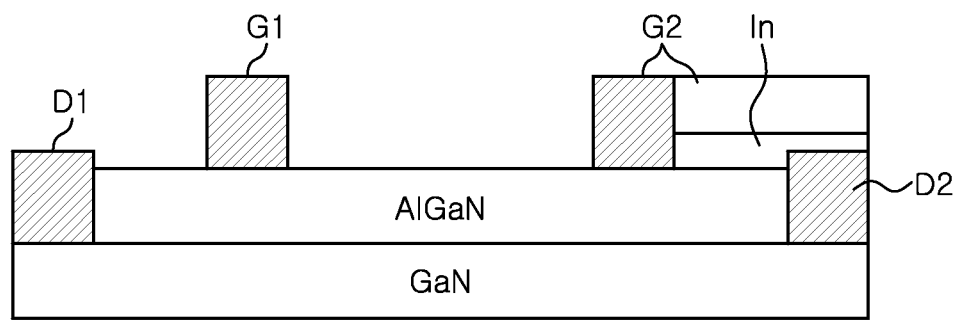
FIG. 11 is a cross-sectional view taken along line XI-XI shown in FIG. 10.

As shown in FIG. 11, the bidirectional switch element 300 includes a first electrode D1 and a second electrode D2 formed on a substrate surface, and a first gate electrode G1 and a second gate electrode G2 at least a part of each of which is formed on the substrate surface, wherein separate control signals are inputted to the first and the second gate electrode G1 and G2. Further, the first gate electrode G1 and the second gate electrode G2 are disposed in such a way that a predetermined withstand voltage can be maintained. Since the bidirectional switch element 300 is configured to have a single portion for maintaining a withstand voltage between the first gate electrode G1 and the second gate electrode G2, it is possible to implement a bidirectional switch element with a small loss. Further, the bidirectional switch element 300 with such a configuration needs to be controlled based on the voltages of the drain electrodes D1 and D2, and therefore it is necessary to input separate drive signals to the respective gate electrodes G1 and G2 (thus, referred to as a dual gate transistor structure). The bidirectional switch element 300 is substantially equivalent to the circuit shown in FIG. 5 in which two vertical MOSFETs are connected in series while their parasitic diodes are directed in the opposite directions.

Figure 12:
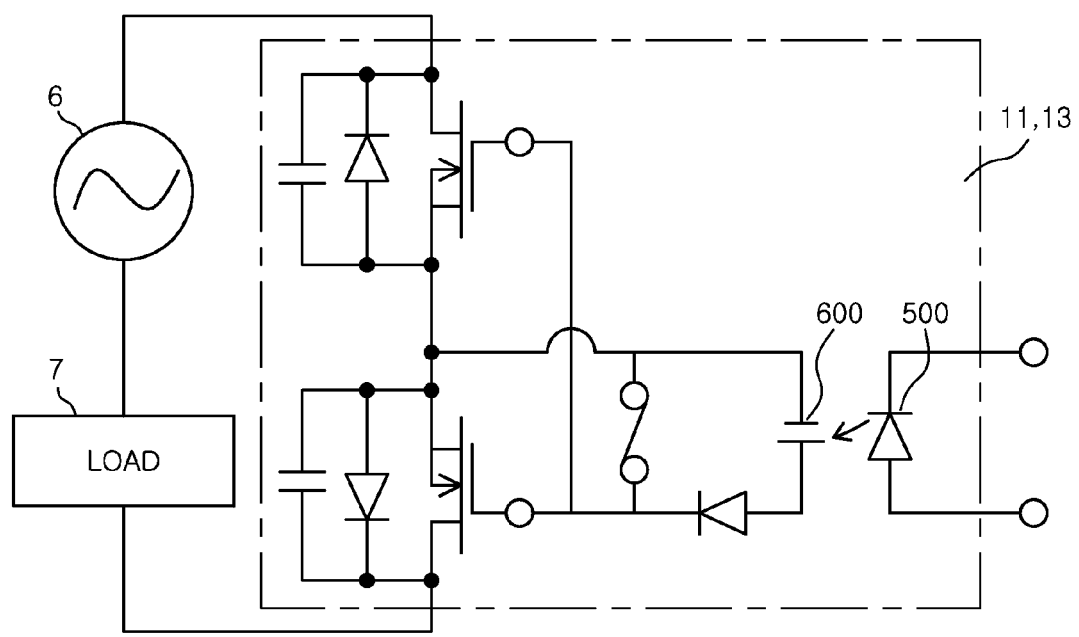
FIG. 12 shows a configuration example in which a MOSFET is used for the switch device of a switching unit, and the gate driving unit has a photo-coupling configuration.

FIG. 12 shows a configuration example in which, for example, the MOSFETs shown in FIG. 5 are used for the switch device of the switching unit 11, and the gate driving unit has a photo-coupling configuration in which a light emitting part 500 and a light receiving part 600 are provided. More specifically, optical MOSFETs are used for the switch device, and the switching unit 11 and the gate driving unit 13 are integrated into a single unit. The control unit 12 controls a current, which flows to turn on a light emitting element for a predetermined period of time, to be higher at the start-up of the load 7 than the current that flows in a steady state. Further, in a case where the switch element having the lateral transistor structure using the GaN/AlGaN structure shown in FIG. 6 or FIG. 9 is used for the switch device, a photo-coupler may be connected to the gate electrode of the switch device. Since the gate driving unit 13 has the photo-coupling configuration, it is possible to successfully control power generated at the secondary side (gate electrode side) by controlling the primary side (light emitting element side).

Figure 13:
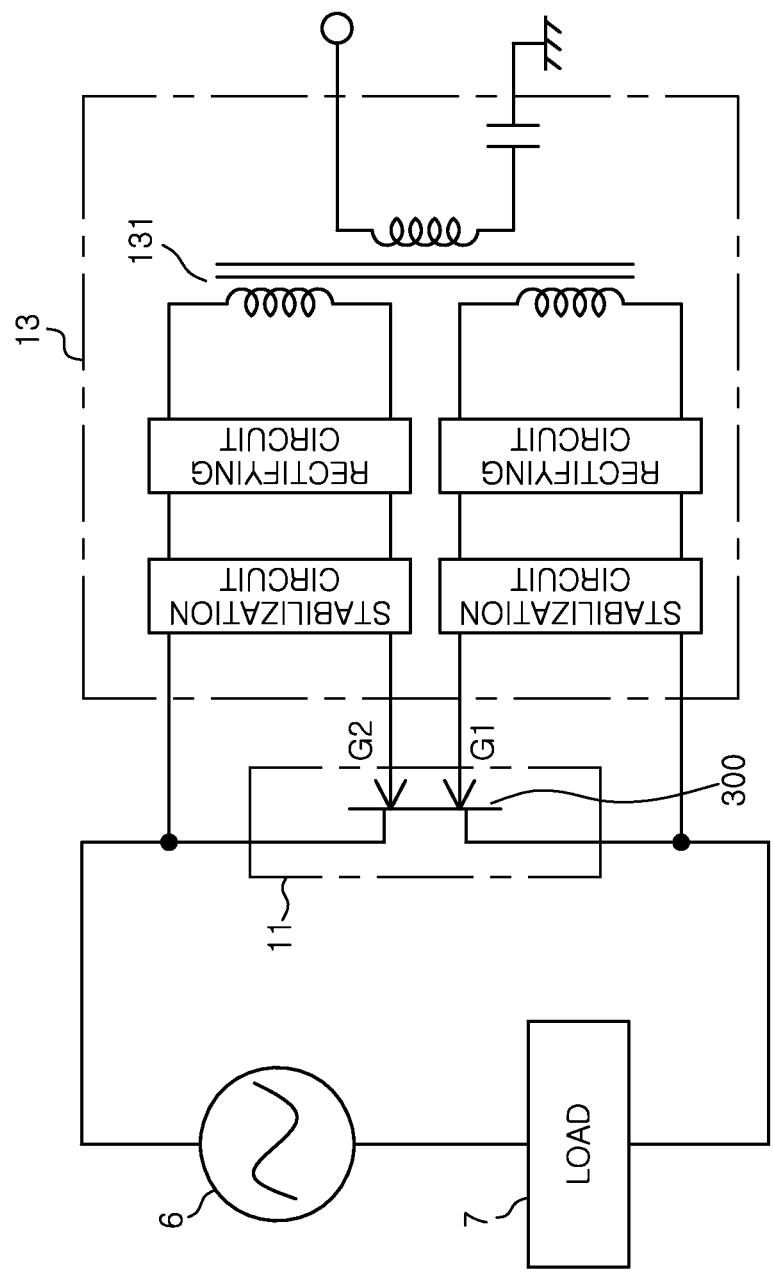
FIG. 13 shows a configuration example in which the bidirectional switch element is used for the switch device, and the gate driving unit has a magnetic coupling configuration.
Figure 14:
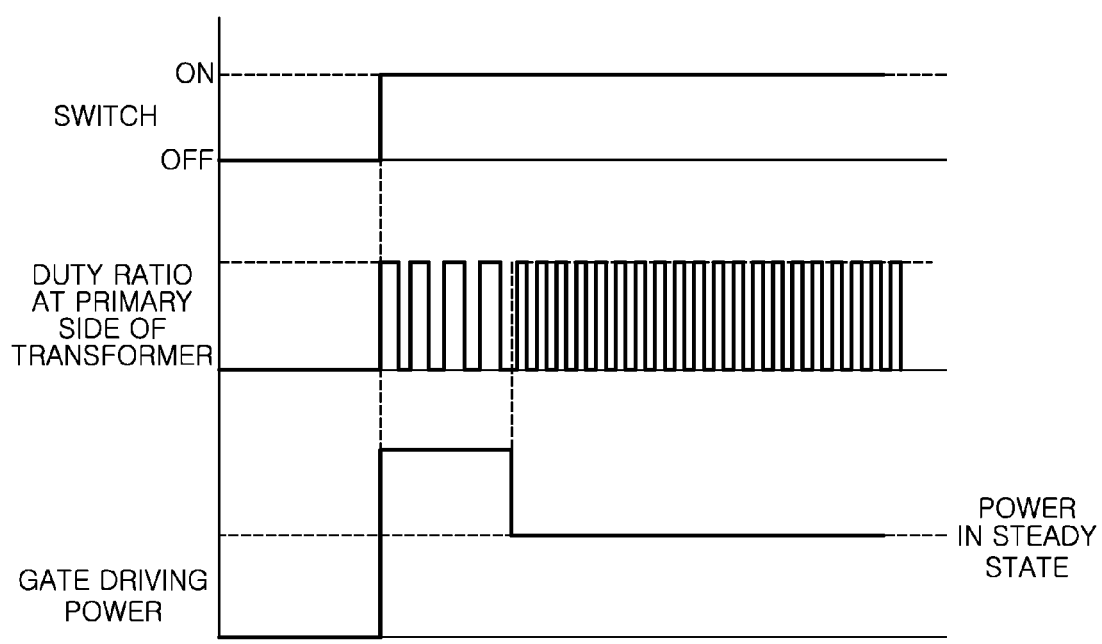
FIG. 14 shows waveforms of a driving signal and the like in the configuration example shown in FIG. 13.

FIG. 13 shows a configuration example in which the bidirectional switch element shown in FIG. 9 is used for the switch device, and the gate driving unit 13 has a magnetic coupling configuration. In the configuration example of FIG. 13, a primary coil of a transformer 131 is electrically insulated from two secondary coils of the transformer 131. Rectifying circuits such as diode bridges and stabilization circuits for stabilizing rectified voltages of the rectifying circuits are connected to the secondary coils of the transformer 131, respectively. FIG. 14 shows waveforms of a driving signal and the like in the case of using the gate driving unit 13 having the magnetic coupling configuration. Under the PWM control of the control unit 12, ON-duty of the driving signal, by which the primary coil of the transformer 131 is switched on and off for a predetermined period of time, is set to be greater at the start-up of the load 7 than in the steady state. Since the gate driving unit 13 has the magnetic-coupling configuration, it is possible to successfully control powers generated at the secondary coils by controlling the switching duty of the primary coil of the transformer 131.

Figure 15:
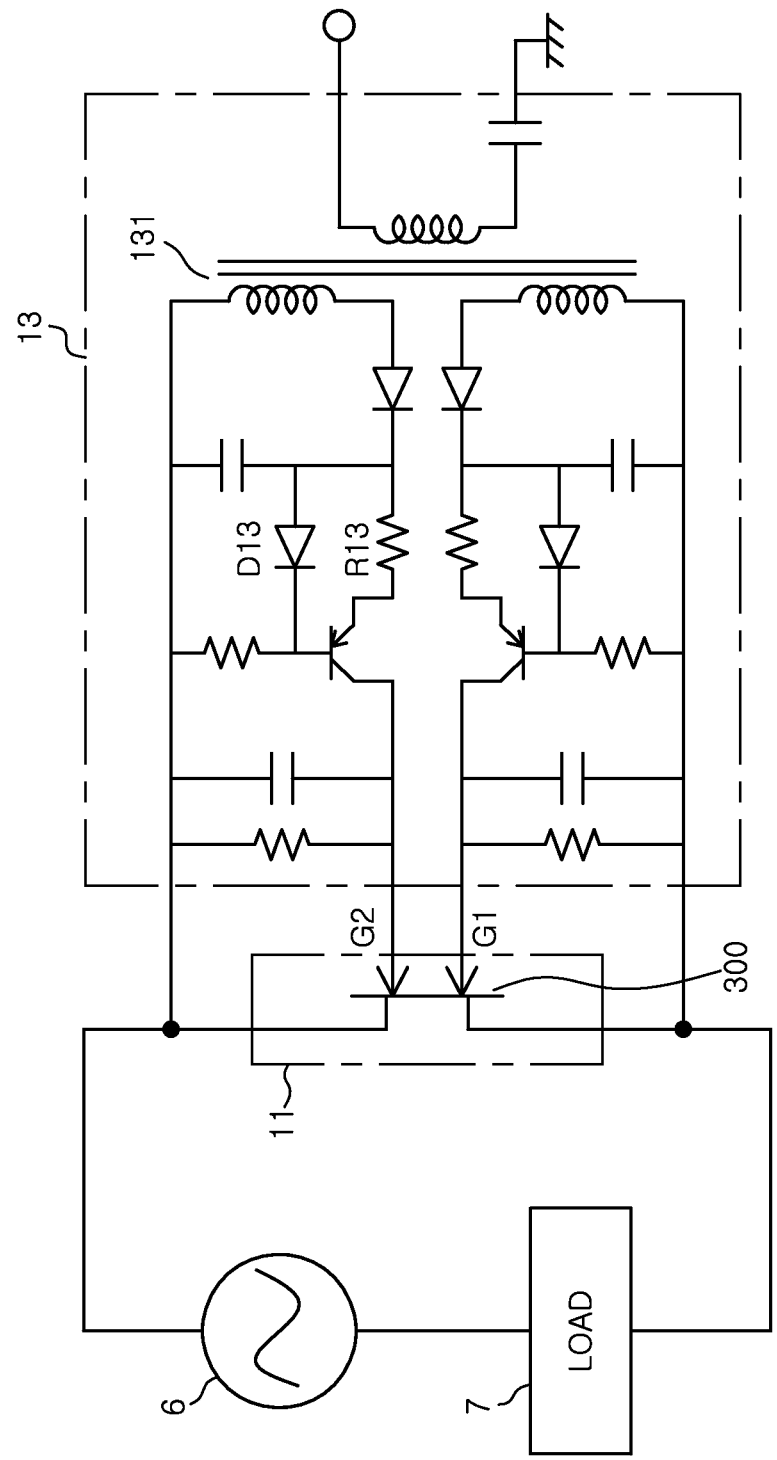
FIG. 15 shows a configuration example in which, with respect to the gate electrode of the switch device, a constant current drive is carried out for a predetermined period of time from the start-up of the load, while a constant voltage drive is carried out during the steady state.

FIG. 15 shows a configuration example in which, with respect to the gate electrode of the switch device, a constant current drive is carried out for a predetermined period of time from the start-up of the load 7, and a constant voltage drive is carried out during the steady state. As described above, the control unit 12 controls ON-duty of the driving signal, by which the primary coil of the transformer 131 is switched on and off for a predetermined period of time, to be greater at the start-up of the load 7 than in the steady state. In other words, currents, which flow through the secondary coils of the transformer 131 for the predetermined period of time after the start-up of the load 7, become higher than those that flow in the steady state, and further a voltage drop occurs across each resistor R13. When the voltage drop across the resistor R13 becomes greater than a forward voltage drop in a diode D13, a current will flow through the diode D13. Accordingly, the current flowing through the gate electrode of the switch device becomes constant (constant current drive). When the ON-duty of the driving signal becomes smaller during the steady state, the current merely flows through the resistor R13 and a constant voltage is applied to the gate electrode of the switch device (constant voltage drive). With such configuration, only necessary amount of the current flows to the gate electrode of the switch device, thereby reducing power consumed by the gate drive of the switch device.

Figure 16:
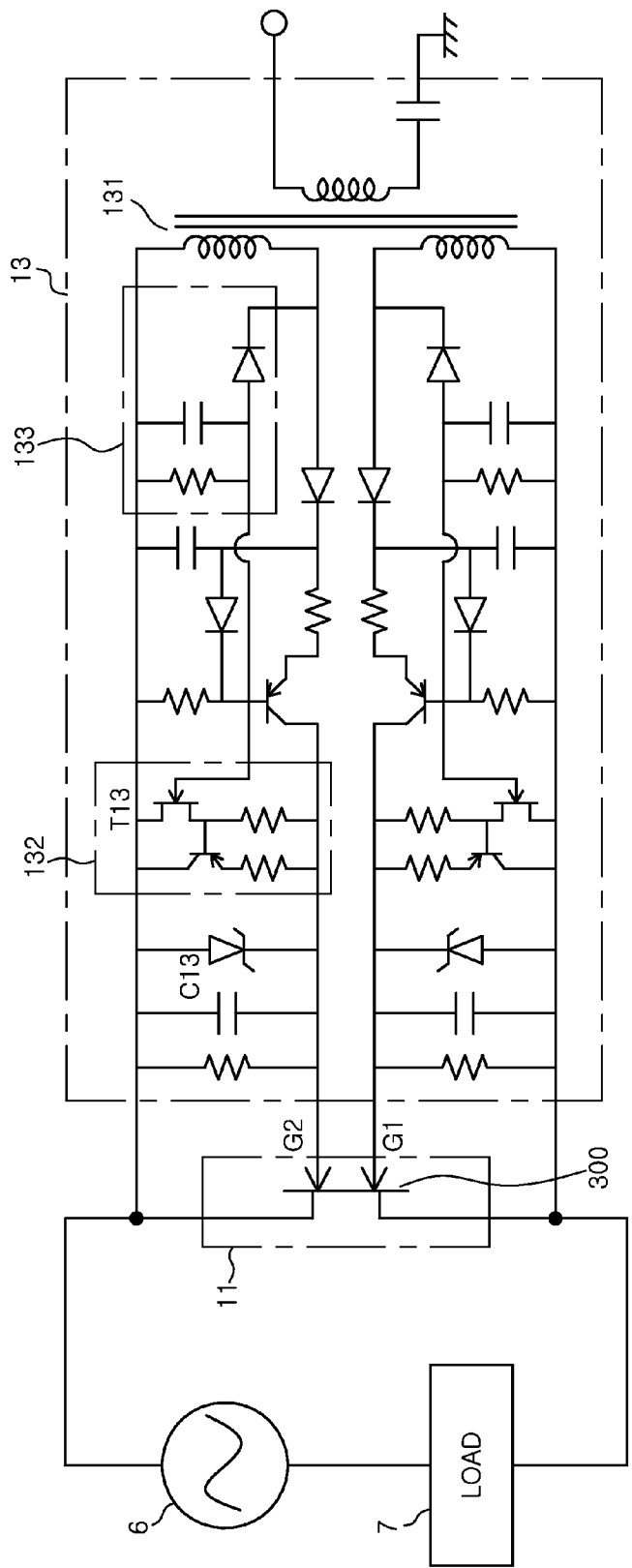
FIG. 16 shows a configuration example in which the gate driving unit shown in FIG. 15 further includes charge extraction units each for extracting residual charges.

FIG. 16 shows another configuration example in which the gate driving unit 13 shown in FIG. 15 further includes charge extraction units 132 each for extracting residual charges accumulated in a capacitor included in the gate driving unit 13, a parasitic capacitance of the switch device, and the like; and driving power source units 133 each for supplying a driving power to the corresponding charge extraction unit 132. As is generally known, the switch device having the transistor structure has a parasitic diode, and electric charges are accumulated in the parasitic diode during the gate drive. The gate driving unit 13 further includes capacitors C13 as a part of the components in its configuration.

Due to the accumulated charges in these capacitances, even if the voltage level of the gate driving signal becomes low, the gate voltage of the switch device is not immediately lowered, and the switch device keeps its conducting state. In this configuration example, each charge extraction unit 132 is operated at the zero cross point of the commercial AC power source, and the residual charges are rapidly extracted out from the gate electrode of the switch device, thereby putting the switch device in a non-conducting state rapidly.

Each of the charge extraction units 132 includes 'normally-on' type transistor T13. The transistor T13 is turned off and the charge extraction unit 132 is not operated when the charges are accumulated in the capacitor C13. The transistor T13 is turned on and the charge extraction unit 132 is operated to rapidly extract the residual charges accumulated in the capacitor C13 and the parasitic capacitance of the switch device when the voltage of the commercial AC power source 6 becomes zero (zero cross point).

Further, each of the driving power source units 133 has a time constant (delay circuit) which allows its power not to be zero during a half cycle of the commercial AC power source 6, and the charge extraction unit 132 is not operated when the primary coil of the transformer 131 is switched on and off.

Figure 17:
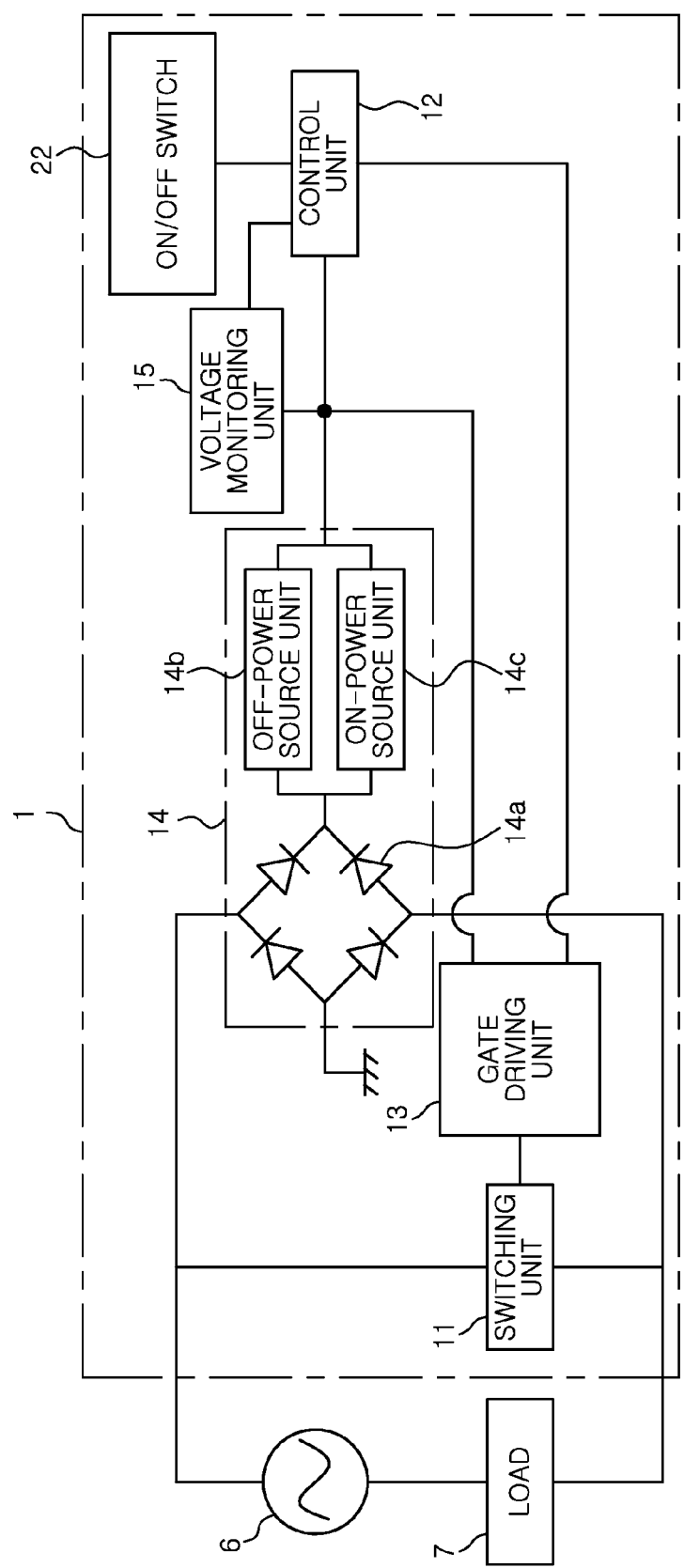
FIG. 17 shows a modification of the configuration shown in FIG. 2 in which a voltage monitoring unit is further included to monitor an output voltage of the power source unit.

FIG. 17 shows a modification of the configuration shown in FIG. 2 in which a voltage monitoring unit 15 is further included to monitor an output voltage of the power source unit 14. In a case where the load control device 1 is the two-wire load control device as shown in FIG. 2, charges accumulated in a buffer capacitor (not shown) of the power source unit 14a are the only power source used for driving the control unit 12 or the gate driving unit 13. In the load control device 1, the ON-duty of the driving signal at the start-up of the load 7 is set to be greater than in the steady state. As a result, the power consumption is increased by that amount compared to that in the steady state, and further the charged power in the buffer capacitor is rapidly consumed. Therefore, the voltage monitoring unit 15 is further provided to monitor the output voltage of the power source unit 14, so that, based on the monitored output voltage of the power source unit 14, the control unit 12 controls the ON-duty of the driving signal at the start-up of the load, which is greater than in the steady state, to be equal to an ON-duty in the steady state.

Figure 18:
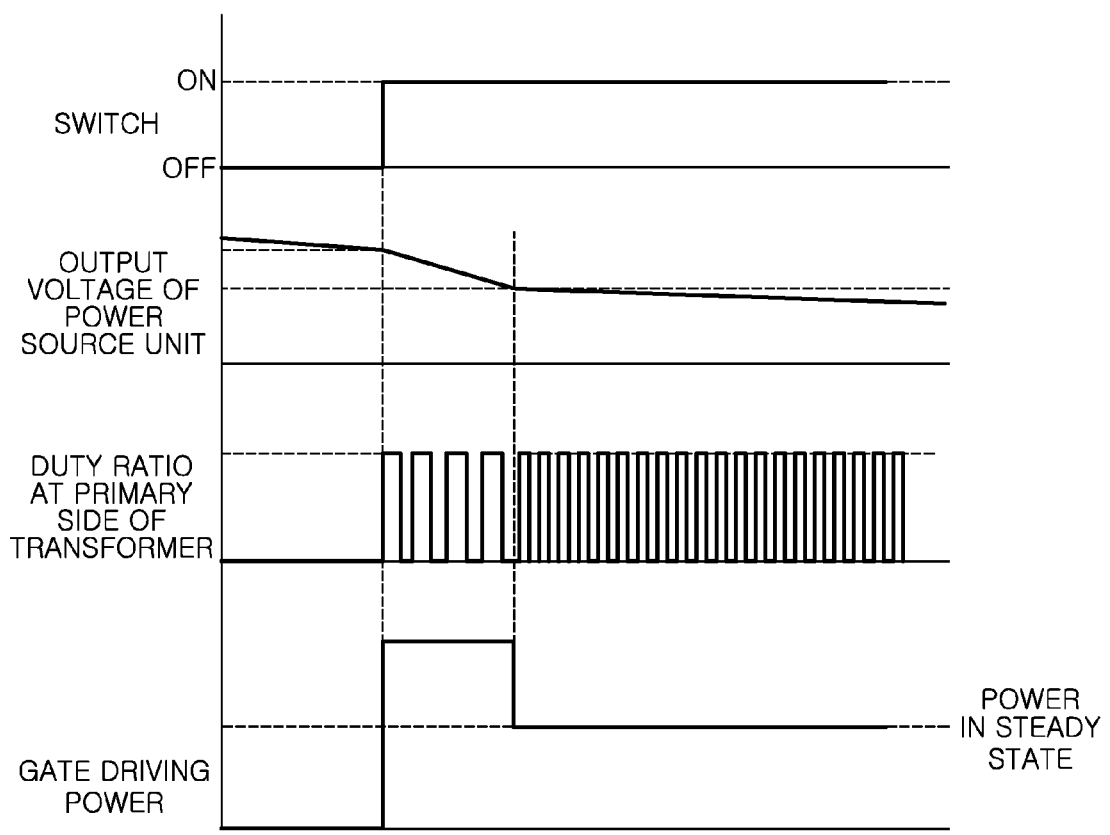
FIG. 18 shows waveforms of a driving signal and the like in the configuration example shown in FIG. 17.

As shown in FIG. 18, the output voltage of the power source unit 14 is gradually lowered by the standby power of the control unit 12 and the like, and is sharply lowered when generating the gate driving signal. Therefore, it is preferable to set the threshold to the output voltage of the power source unit 14 such that the ON-duty of the driving signal is changed to the value of that in the steady state when the output voltage of the power source unit 14 is equal to or less than the threshold. The power consumption of the buffer capacitor may thereby be suppressed. Further, the voltage monitoring unit 15 is applicable to the third-wire load control device and is effective in reducing the power consumed when generating the gate driving signal.

The present invention is not limited to the embodiment described above, and various changes and modifications may be made without departing from the scope of the invention. For example, a power source for supplying power to the load 7 is not limited to the commercial AC power source 6, and a DC power source may be used. A photovoltaic device having solar panels and the like may be used as an example of the DC power source, and the load 7 that is connected to the DC power source may be, e.g., a battery for use in an electric vehicle and the like.

Figure 21:
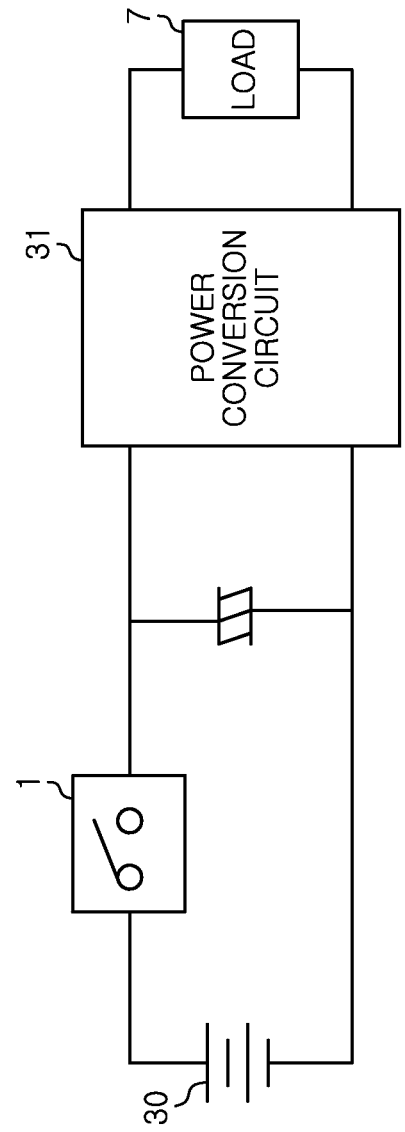
FIG. 21 shows a usage example of the load control device.

FIG. 21 shows a usage example of the load control device 1 in accordance with the present invention. The load control device 1 is connected in series to a power conversion circuit 31 provided for supplying power to a DC power source 30 and the load 7. Here, the load control device 1 serves as a relay for controlling a DC power to be supplied to the power conversion circuit 31. Accordingly, the load control device 1 can be used as a general relay to control power to be supplied to the power conversion circuit 31 or power to be directly supplied to the load 7.

Further, the power source unit 14 obtains power regularly from the commercial AC power source 6 as shown in FIGS. 2 and 3, but it is not limited thereto. The power source unit 13 may be configured to obtain power from other power systems.

Figure 19:
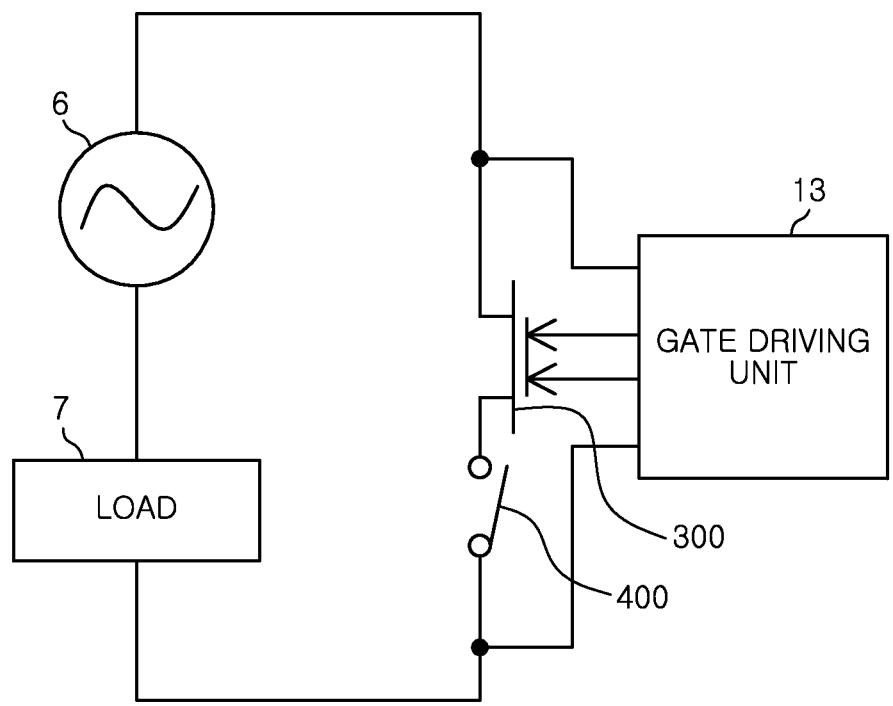
FIG. 19 shows a modification of the configuration example shown in FIG. 9.

FIG. 19 shows a modification of the configuration example shown in FIG. 9 in which the bidirectional switch element having the lateral transistor structure using the GaN/AlGaN structure is used for the switch device. In this modification, the switch device having the transistor structure is connected in series to a mechanical relay (switch element) 400 having contacts. The mechanical relay 400 performs its switching operation based on the control signal outputted from the control unit 12. In this modification, when closing the bidirectional switch element 300, the switch element 400 is closed first and then the bidirectional switch element 300 is closed. When opening the bidirectional switch element 300, the bidirectional switch element 300 is opened first and then the switch element 400 is opened. With such configuration, by properly controlling both of the bidirectional switch element 300 having the transistor structure and the switch element having contacts, which are connected in series to each other, it becomes possible to suppress an arc generation during the switching operation. Further, it is possible to improve an isolation property of a power supply interruption unit when interrupting the supply of power.

Figure 20:
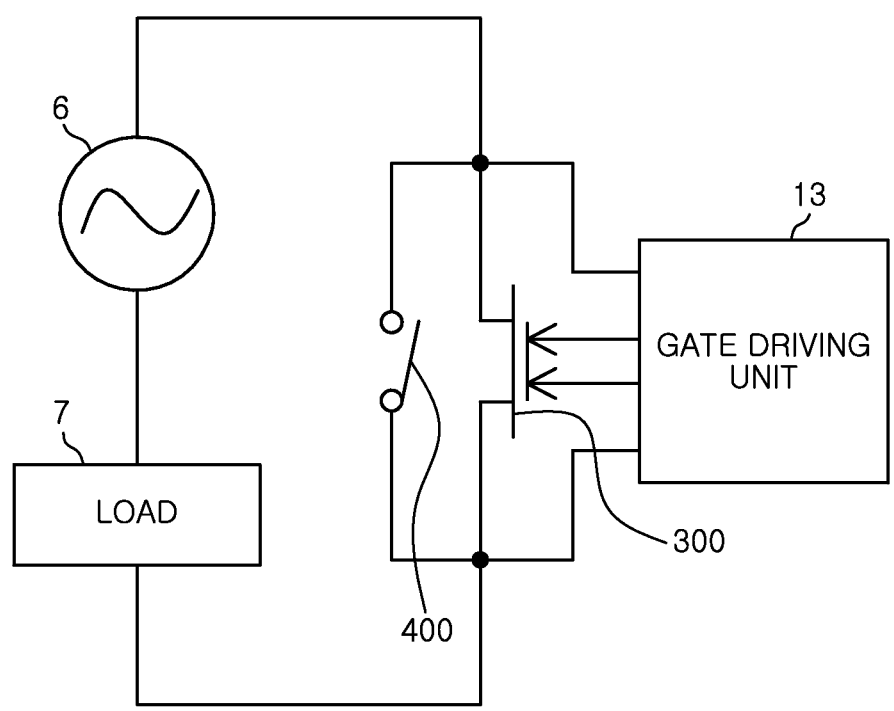
FIG. 20 shows another modification of the configuration example shown in FIG. 9.

Further, FIG. 20 shows another modification of the configuration example shown in FIG. 9 in which the bidirectional switch element having the lateral transistor structure using the GaN/AlGaN structure is used for the switch device. In this modification, the switch device having the transistor structure is connected in parallel to the mechanical relay (switch element) 400 having contacts. The mechanical relay 400 performs its switching operation based on the control signal outputted from the control unit 12. In this modification, when closing the bidirectional switch element 300, the bidirectional switch element 300 is closed first and then the switch element 400 is closed. When opening the bidirectional switch element 300, the switch element 400 is opened first and then the bidirectional switch element 300 is opened. With such configuration, by properly controlling both of the bidirectional switch element 300 having the transistor structure and the switch element having contacts, which are connected in parallel to each other, it becomes possible to suppress an arc generation during the switching operation. Further, it is possible to allow a large amount of current to flow in the load 7.

Further, the features illustrated in the configuration examples and the drawings of the present invention can be combined with each other in any suitable manner. In addition, the types of the switch device included in the switching unit 11, the configurations of the control unit 12 and the gate driving unit 13 are not particularly limited to those described in the embodiments of the present invention.

While the invention has been shown and described with respect to the embodiments, it will be understood by those skilled in the art that various changes and modification may be made without departing from the scope of the invention as defined in the following claims.

What is claimed is:

1. A load control device comprising:
   a switching unit, which is connected to a power source and a load in series, including a switch device having a transistor structure;
   a control unit configured to control start-up and stop of the load; and
   a gate driving unit, which is electrically insulated from the control unit and is configured to output a gate driving signal to a gate electrode of the switch device,
   wherein the control unit is configured to control the gate driving unit such that an average driving power supplied to the gate electrode of the switch device through the gate driving signal is higher for a period of time starting at the start-up of the load than in a steady state.

2. The load control device of claim 1, wherein the gate driving unit is electrically insulated from the control unit by having a photo-coupling configuration in which a light emitting part and a light receiving part are provided, and wherein the control unit is configured to control a current, which flows to turn on a light emitting element to be higher for the period of time starting at the start-up of the load than in the steady state.

3. The load control device of claim 1, wherein the gate driving unit is electrically insulated from the control unit by having a magnetic-coupling configuration in which a transformer is provided, and
   wherein the control unit is configured to control an ON-duty of a driving signal for switching on and off a primary coil of the transformer to be greater for the period of time starting at the start-up of the load than in the steady state.

4. The load control device of claim 1, wherein the switch device has a configuration in which two vertical transistor elements are connected in series with their parasitic diodes directed in opposite directions.

5. The load control device of claim 1, wherein the switch device has a configuration in which two lateral transistor elements are connected in series such that the two lateral transistor elements are driven by the gate driving signal obtained by using a voltage at a connection node therebetween as a reference.

6. The load control device of claim 1, wherein the switch device includes a bidirectional switch element having a lateral transistor structure which uses a GaN/AlGaN structure and has two gate electrodes.

7. The load control device of claim 3, wherein the gate driving unit further includes:
   a charge extraction unit configured to extract residual charges accumulated in the gate electrode of the switch device;
   a driving power source unit configured to drive the charge extraction unit; and
   a delay circuit which allows the charge extraction unit not to be operated when the primary coil of the transformer is switched on and off.

8. The load control device of claim 1, wherein the load control device is a two-wire load control device connected in series between the power source and the load, the power source being a commercial AC power source, and the two-wire load control device further includes a power source unit configured to ensure power to operate the control unit and the gate driving unit, and
   wherein the power source unit is connected in parallel to both terminals of the switching unit and operates at every half cycle of the commercial AC power source to ensure an internal power even while the load is not operated.

9. The load control device of claim 3, further comprising:
   a power source unit configured to ensure power to operate the control unit and the gate driving unit, and a voltage monitoring unit configured to monitor an output voltage of the power source unit,
   wherein the control unit controls an ON-duty of the driving signal at the start-up of the load, which is greater than in the steady state, to be equal to an ON-duty in the steady state based on the monitored output voltage of the power source unit.

10. The load control device of claim 3, with respect to the gate electrode of the switch device, the gate driving unit is configured to perform a constant current drive for the period of time starting at the start-up of the load and perform a constant voltage drive in the steady state.

11. The load control device of claim 4, wherein the switch device has a configuration in which the vertical transistor elements and a switch element having contacts are connected to each other in series.

12. The load control device of claim 5, wherein the switch device has a configuration in which the lateral transistor elements and a switch element having contacts are connected to each other in series.

13. The load control device of claim 6, wherein the switch device has a configuration in which the bidirectional switch element having the lateral transistor structure and a switch element having contacts are connected to each other in series.

14. The load control device of claim 4, wherein the switch device has a configuration in which the vertical transistor elements and a switch element having contacts are connected to each other in parallel.

15. The load control device of claim 5, wherein the switch device has a configuration in which the lateral transistor elements and a switch element having contacts are connected to each other in parallel.

16. The load control device of claim 6, wherein the switch device has a configuration in which the bidirectional switch element having the lateral transistor structure and a switch element having contacts are connected to each other in parallel.

17. The load control device of claim 1, wherein the period of time is set as sufficient time for an inrush current to fully flow from the power source to the load via the switch device at the start-up of the load.

18. The load control device of claim 1, wherein the control unit includes a processor.

* * * * *